United States Patent [19]

Bintig et al.

[11] 4,371,806

[45] Feb. 1, 1983

[54] LUMINESCENT SCREEN WITH GRID STRUCTURE FOR X-RAY IMAGE INTENSIFIER

[75] Inventors: Werner Bintig, Erlangen; Hermann Christgau, Fuerth, both of Fed. Rep. of Germany

[73] Assignee: Siemens Aktiengesellschaft, Berlin & Munich, Fed. Rep. of Germany

[21] Appl. No.: 170,091

[22] Filed: Jul. 18, 1980

[30] Foreign Application Priority Data

Jul. 23, 1979 [DE] Fed. Rep. of Germany ....... 2229745

[51] Int. Cl.³ ..................... H01J 40/00; G01T 1/20
[52] U.S. Cl. ................. 313/101; 250/213 VT
[58] Field of Search .............. 313/101; 250/213 VT

[56] References Cited

U.S. PATENT DOCUMENTS

| 3,783,298 | 1/1974 | Houston | 250/213 VT X |
| 4,147,949 | 4/1979 | Yang | 313/101 |
| 4,239,791 | 12/1980 | Sonoda et al. | 427/64 |

FOREIGN PATENT DOCUMENTS

| 2647660 | 4/1978 | Fed. Rep. of Germany | 313/101 |
| 2810920 | 9/1978 | Fed. Rep. of Germany | 250/213 VT |
| 2852440 | 6/1979 | Fed. Rep. of Germany | 313/101 |
| 54-14153 | 2/1979 | Japan | 313/101 |
| 54-79495 | 2/1979 | Japan | 313/101 |
| 1586141 | 3/1981 | United Kingdom | 313/101 |

*Primary Examiner*—Robert Segal
*Attorney, Agent, or Firm*—Hill, Van Santen, Steadman, Chiara & Simpson

[57] ABSTRACT

In the exemplary embodiments, the luminescent layer is applied to a carrier exhibiting a grid which is applied in the manner known per se in applying photo grids. Thereby, however, it is disadvantageous that the grid interstices exhibit only a small depth, so that the grid structure disappears as the luminescent layer is applied with increasing thickness. In order to avoid this disadvantage, the disclosure provides that the carrier also be etched after application of the grid, so that the grid interstices receive the shape of enlarged recesses of greater depth. The luminescent layer applied to this grid then retains the grid-like interruptions even given a greater thickness. An inventive luminescent screen receives improved image transmission properties and is particularly suited for employment as an X-ray (image intensifier) luminescent screen in medical X-ray diagnostics.

8 Claims, 12 Drawing Figures

LUMINESCENT SCREEN WITH GRID STRUCTURE FOR X-RAY IMAGE INTENSIFIER

BACKGROUND OF THE INVENTION

The invention relates to a luminescent screen with a grid structure according to the generic part of patent claim 1. Such screens are known, for instance, from the German OS No. 26 47 660.

In the known screen, the luminescent substance is applied to a grid which is manufactured of a photosensitive layer, in that this layer is exposed behind a mask corresponding to the grid and is then treated for removal of the superfluous material in the manner known in applying photo grids. However, only the pit ratio of 1:1 generally prevailing in photo reproduction technology can be thus achieved. Due to the possible film thickness of from two through five microns (2 through 5 $\mu$m), this means a pit depth which only corresponds to the possible peak-to-valley height of up to five microns (5 $\mu$m) which is otherwise possible in roughening aluminum carriers. This lower depth of the grid interstices, however, represents a limitation of the possibility of improving the grid structure and, thus, the resolution of the screen.

SUMMARY OF THE INVENTION

The object of the invention is to specify a structure in a luminescent screen according to the generic part of patent claim 1 which makes it possible to diminish the grid structure without being forced to accept a coalescence of a part of the grid when the luminescent substance is applied. This object is inventively achieved by means of the features cited in the characterizing part of said claim. The sub-claims contain advantageous further developments of the invention.

By employing a carrier which is also etched in addition to the applied photo grid, it is achieved that the coalescence of the luminescent substance deposits being built up on the grid nubs is prevented to the greatest possible degree. This is apparently to be attributed to the fact that the growth in thickness of the luminescent layer ensues more slowly in the etching troughs than on the nubs due to being shielded by the surrounding nubs, and, thus, the coupling element between neighboring layers growing on nubs is lacking.

By means of an increased etching of the carrier, the area of grid points can be diminished in varying degrees. The applied photo points can be easily removed by dissolving in organic solvent. Thus, given the same grid parameter, any desired ratio between the absolute magnitudes of the area of the remaining nub and of the etching trough can be achieved. Given an isotropically attacking etching agent, a half of the dimension results for the trough width and for the trough depth. This produces the advantage that the coalescence of neighboring luminescent layer components can be terminated by means of controlled etching of various degree.

At first, the photo grid can be manufactured as in the German OS No. 26 47 660 cited above in that a photoelectric layer, for example photosensitive polyimide material, is applied which is then exposed through an exposure mask (vignette). Suitable materials are described, for instance, in the German LP No. 2,308,830 and the German OS No. 24 37 348 and OS No. 24 37 422 as well as in "Polymer Engineering and Science," September 1971, Vol. 11, No. 5, pages 426 through 430.

The photosensitive layer can be produced according to a lacquering method known per se or similar methods. After the exposure of the grid, preferably with ultraviolet (UV) rays, the unexposed parts of the layers are removed with organic solvents, for example, in an immersion or spray development process. Suitable solvents, for example, are a 1:1 mixture of dimethylformamide and ethanol or gammabutyrolacetone. The remaining photo-interlaced parts of the grid are finally converted into stable synthetic by means of heating, for example 30 minutes at 275° C. and, subsequently, 10 through 15 minutes at 400° C.

As in the known method, the grid can be adapted to the desired resolution of the luminescent screen. Given a point grid for the input screen of an X-ray image intensifier, for example, a point grid is suitable in which the side length amounts to a value in the range from five to thirty microns (5 to 30 $\mu$m) given an interval of the points from one another of a selected value in the range from three through forty microns (3 through 40 $\mu$m), particularly ten microns (10 $\mu$m), when a luminescent screen of sixty milligrams (60 mg) cesium iodide activated with sodium is provided per square centimeter (cm$^2$). If a thicker luminescent substance coating is planned, then the dimensions change dependently.

Before application of the luminescent layer by means of vacuum deposition, the carrier is inventively further prepared in that the grid applied up to now is subjected to a further etching process. This can be achieved in the above sense in that the exposed surfaces of the carrier material between the synthetic nubs are converted into troughs by means of treatment, for instance immersion or spraying, with an etching mixture known per se consisting of concentrated mineral acids. The etching mixture, for example, can be composed of 80 volume parts o-phosphoric acid, 10 volume parts sulfuric acid and 10 volume parts nitric acid, whereby it is advantageous when an additive of a small amount of heavy metal salt (approximately 1/100 part by weight, that is one percent by weight) is present whose anion is the acid anion of one of the said mineral acids, for example iron sulfate. Salts of other agents, such as manganese, magnesium, nickel or copper, may likewise be employed.

In order to generate an extreme point grid, this latter etching of the grid is carried out in such manner that, given a temperature increased to a value in the range from approximately 100° through 120° C., the contact area between the synthetic nub and carrier metal is reduced to a value in the range from three through one hundred square microns (3 through 100 $\mu$m$^2$).

Instead of employing synthetic as the covering for producing the grid before the etching, other etching and heart-resistant substances can be employed such as, for example, a coating of nickel. This can be applied, for example on an aluminum disc, to a thickness of a value in the range from two through twenty microns (2 $\mu$m through 20 $\mu$m) by means of galvanic or current-free reduction of nickel compounds. Then, a photo grid is first applied, this is etched with acid until the grid (i.e. the acid) has completely penetrated the nickel layer and then a further etching of the carrier metal ensues by means of caustic solution, particularly two gram molecular weights per liter (2 M) sodium hydroxide soluton (NaOH).

In order to apply the luminescent substance, the cleaned and etched carriers, i.e. grid plates or, respectively, dishes, which essentially consist of an X-ray permeable material, particularly aluminum, are placed in a vacuum deposition apparatus and are coated to the desired thickness with cesium iodide activated with sodium.

Further details and advantages of the invention are explained below on the basis of exemplary embodiments illustrated in the figures of the accompanying drawing sheet; other objects, features and advantages will be apparent from this detailed disclosure and from the appended claims.

DETAILED DESCRIPTION

Figure 1:
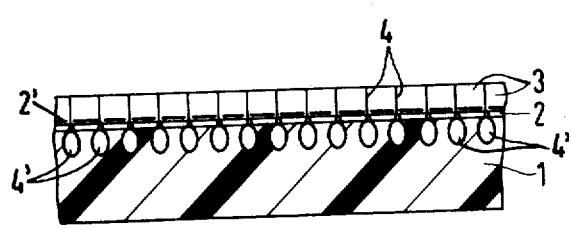
FIG. 1 shows a partial somewhat diagrammatic section of a luminescent screen inventively provided with an undercut grid.

In FIG. 1, 1 indicates a two-tenths of a millimeter (0.2 mm) thick carrier of polyimide (Pi) and 2 indicates a grid of polyimide (Pi) applied to the carrier and two microns (2 $\mu$m) thick. A two hundred nanometer (200 nm) thick layer 2' of aluminum is applied to the coatings of Pi forming the grid 2, said layer 2' on the one hand separating the luminescent substance from the Pi and, on the other hand, having a reflecting effect. The actual luminescent layer of cesium iodide is referenced with 3 and is vacuum deposited onto the grid 2. Due to the arrangement of the grid points 2, the prerequisite is given for interruptions 4 and 5 (FIG. 2) being formed in the luminescent layer. On the other hand, the carrier 1 receives expanded recesses 4' along the interstices between the coatings due to the additional operation.

Figure 3:
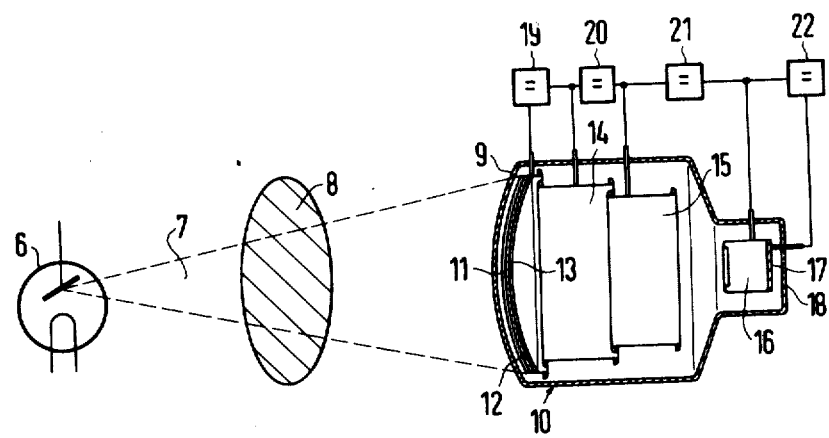
FIG. 3 is a diagrammatic view showing an X-ray image intensifier arrangement in which a luminescent screen provided with an inventive grid is employed in the input section of the image intensifier.

In the arrangement according to FIG. 3, reference numeral 6 indicates an X-ray tube emitting a radiation beam 7 which penetrates a body 8 to be examined and enters into an image intensifier 10 through an entrance window 9. There, the beam first penetrates a carrier 11 of aluminum which represents a calotte with a luminescent layer 12 applied to its inside and which in turn exhibits a cathode layer 13. Electronic imaging electrodes 14, 15 and 16 follow the cathode layer 13, and imaging electrode 16 is terminated with an output luminescent screen 17 which lies behind the viewing window 18 of the image intensifier 10.

The operation of the image intensifier 10 ensues in a known manner in that a voltage of 100 volts is present between the input layers 11 through 13 and the electrode 14, due to a constant current source 19; a voltage of one kilovolt (1 kV) between electrodes 14 and 15 due to a constant current source 20; as well as a voltage of four kilovolts (4 kV) between electrodes 15 and 16 due to a source 21. Finally, a constant voltage of 25 kV from source 22 lies between anode 16 and the screen 17. Thus, the imaging of electrons emerging from the photocathode layer 13 is achieved on the screen 17. The luminescent image can be viewed through the window 18. Instead of direct observation, an exposure or, respectively, further electronic processing can ensue in a known manner, for instance in a television system. The electric supply of the image intensifier illustrated in FIG. 3 as comprising voltage sources 19 through 22 for the sake of simplicity, usually ensues via a voltage supply unit which is fed proceeding from the mains.

As in the known screen, a propagation of light perpendicular to the irradiation direction is also largely avoided in the screen according to the invention by means of the employment of the grid-patterned luminescent layer 12. This leads to a reduction of a brightening of the background. Moreover, that part of the luminescent light which would not directly arrive in the photocathode layer 13 is deflected by the grid, at least partially, and by reflection at layer 2', so that it also strikes the photocathode 13 and effects an improvement of the conversion of the incident rays of beam 7.

Figure 4:
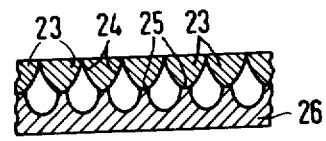
FIG. 4 is a partial sectional view showing the employment of a grid plate as a luminescent screen carrier in which the material forming the photo grid is removed before application of the luminescent screen.

FIG. 4 illustrates an exemplary embodiment in which the undercutting is continued until small grid points arise. The screen then consists of vacuum deposited luminescent substance parts 23 which are separated from one another by interstices 24 and which are vacuum deposited onto the small surfaces 25 of the grid of carrier 26 of aluminum.

It will be apparent that many modifications and variations may be effected without departing from the scope of the novel concepts and teachings of the present invention.

Figure 5:
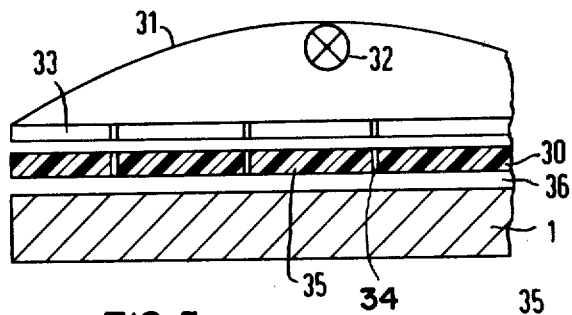
FIG. 5 is a partial sectional view of a carrier plate covered with a photosensitive layer and a device to expose the layer through an exposure mask.

In FIG. 5 in a partial sectional view is shown a device to cover a carrier plate 1 with a photosensitive grid. In a first step a photosensitive layer 30 is applied on the surface of the carrier 1 which is then in a second step exposed from a device 31 by a lamp 32 through an exposure mask 33. Prior to the covering with the layer 30 in this example a coating 36 of nickel is applied to the surface of the carrier 1. This coating 36 of nickel (Ni) is applied on the Pi disc of plate 1, to a thickness of five microns (5 $\mu$m) by means of galvanic reduction of nickel-chloride ($NiCl_2$).

The photosensitive layer 30 consists of photosensitive methacrylate and is produced according to a lacquering method known per se and is 2 $\mu$m thick on the carrier consisting of polyimide (Pi). After the exposure of the grid, preferably with ultraviolet (UV) rays from the lamp 32, the unexposed parts 34 of the layer 30 in a third step are removed with a solvent which is an alkaline developer. Troughs 37 (FIG. 6) and photo-interlaced parts 35 of the grid remain on the carrier 1.

When the photo grid is applied the nickel layer 36 is etched with acid until the grid (i.e. the acid) has completely penetrated the nickel layer 36 and then a further etching of the carrier 1 plastic (Pi) ensues by means of two gram molecular weights per liter (2 M) sodium hydroxide solution (NaOH). So an etched carrier is achieved with parts 35 which have distances of their centers of microns (90 μm) and side lengths of seventy microns (70 μm). The interstices 37 have widths of twenty microns (20 μm) and depths of ten microns (10 μm). Finally the parts 35 are removed by dissolving then with an organic solvent. Then remains a carrier 1 covered with parts 38 of nickel (see FIG. 7).

Figure 6:
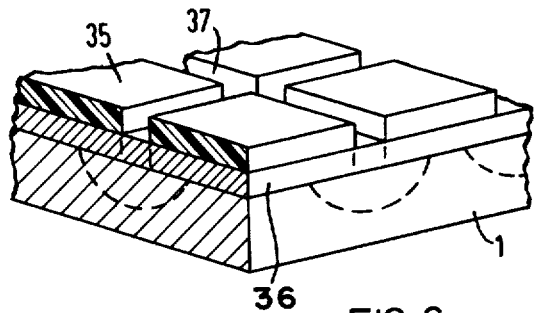
FIG. 6 is a partial sectional view of a carrier plate according to FIG. 5 of which the unexposed parts are removed.
Figure 6A:
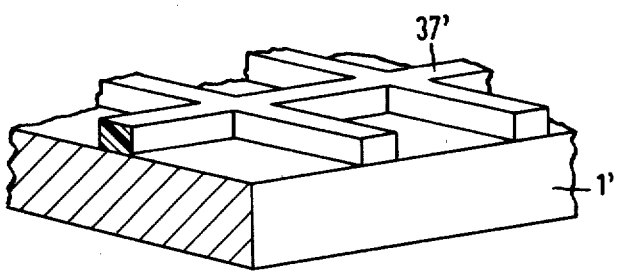
FIGS. 6a and 6b are somewhat diagrammatic perspective views illustrating an alternative procedure for producing a grid structure on a carrier plate wherein a coating of nickel is used to define the grid configuration.
Figure 6B:
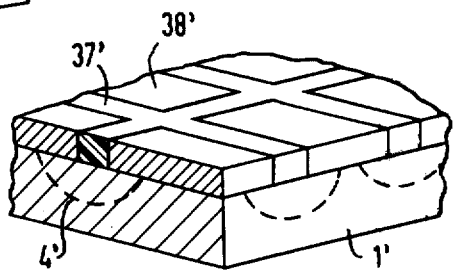

A carrier 1 also can be covered with parts 38 of nickel by making a photo grid according to FIG. 6 but by dissolving the parts 35 away (FIG. 6a) and not the lines which are then indicated at 37' in FIG. 6a. For this the exposure mask 33 is exchanged for one having transparent grid lines for projection of lines 34 and opaque points for the other parts 35. Then all other steps are carried out according to FIG. 6. Then the nickel is evaporated onto the carrier at 38' (FIG. 6b) and finally the grid of 37' is dissolved away.

Finally in order to apply the luminescent substance, the cleaned and etched carrier 1 provided with parts 38 of nickel, i.e. grid plate, is placed in a vacuum of $10^{-3}$ Torr of a deposition apparatus and is heated to 200° C. and then coated to a thickness of 250 μm with cesium iodide activated with sodium. The latter, growing on the parts 38 of the carrier 1 in the form of columns, is to be seen in FIG. 7. During the coating process the carrier 1 is held at a temperature of 200°. The columns forming parts 3 stand side by side and form a grid 4, 5 (FIG. 2) on the surface.

Figure 8:
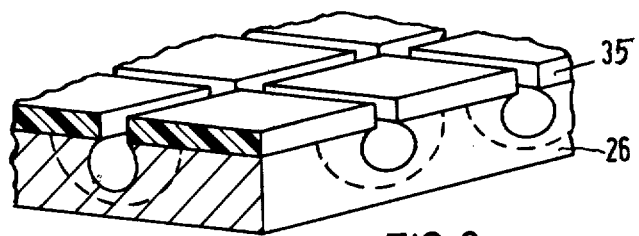
FIG. 8 is a partial sectional view of a carrier plate subjected to a further etching process.

In FIG. 8 is shown a device for a further etching process to get a carrier 26 used for a luminescent screen of FIG. 4. This process is started by covering a plate of 0.5 mm thick aluminum with a photosensitive layer and making a grid as shown in FIGS. 5–6, with the difference that the layer 30 consists of polyimide and the solvent is a 1:1 mixture of dimethylformamide and gammabutyrolactone. Additionally, no layer of nickel is used.

The etching process is achieved in that the exposed surface of the carrier 26 between the parts 25 is covered with troughs by means of immersion, with an etching mixture of 80 volume parts o-phosphoric acid, 10 volume parts sulfuric acid and 10 volume parts nitric acid, with an additive of 1/100 part by weight (that is one percent by weight) iron sulfate. During this latter etching the temperature increased to approximately 120° C. So the carrier metal is reduced to a value in the range of four square microns (4 μm$^2$).

Figure 9:
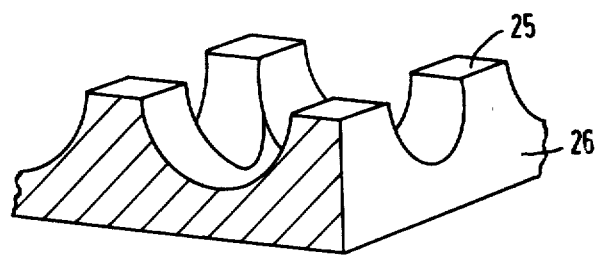
FIG. 9 is a partial sectional view of the etched carrier plate.
Figure 10:
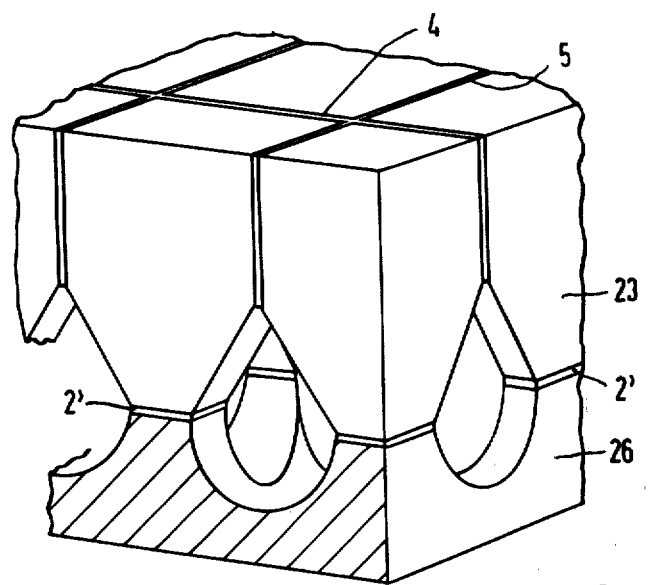
FIG. 10 shows a luminescent screen the etched carrier of which is coated with luminescent material.

Then the applied photoparts 35, FIG. 8, are removed by dissolving in organic solvent. Prior to the application a reflection layer 2' of aluminum being 0.2μm thick is deposited by vacuum evaporating on the carrier which has now the form of a plate with nubs 25 as shown in FIG. 9. Finally column like parts 23 (corresponding to parts 3 of FIG. 7) are formed as the luminescent layer by evaporation in a vacuum of $10^{-3}$ Torr to a thickness of 120 μm on the carrier heated to a temperature of 200° C. during this covering step.

Supplementary Discussion

Figure 7:
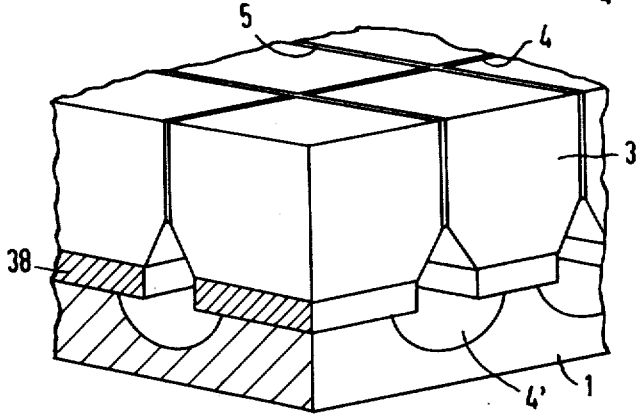
FIG. 7 is a partial sectional view of a carrier plate covered with a coating of nickel.

By employing a carrier 1, 11 or 26 which is also etched as at 4', FIG. 1 or 7 in addition to the applied photo grid (e.g. 2, 4, 5, FIG. 2, it is achieved that the coalescence of the luminescent substance deposits e.g. cesium iodide 23, FIG. 4) being built up on the grid nubs (as at 25, FIG. 4) is prevented to the greatest possible degree. This is apparently to be attributed to the fact that the growth in thickness of the luminescent layer 3, 12 or 23 ensues more slowly in the etching troughs (e.g. at 4, 5, FIG. 2; 4'', FIG. 1) than on the nubs (e.g. at 25, FIG. 4) due to being shielded by the surrounding nubs, and, thus, the optical coupling (or polycrystalline homogeneity) between neighboring layers growing on respective adjacent nubs is avoided for the desired luminescent layer thickness, e.g. one hundred and twenty microns.

By means of an increased etching of the carrier 1, 11 or 26, the area of grid points such as 25, FIG. 4, can be diminished to a desired degree. The applied photo points such as 2, FIG. 2, of photosensitive material such as Pi can be easily removed by dissolving in organic solvent prior to application of the luminescent layer, the layer 2' being omitted. Thus, given the same grid parameter, (e.g. ten microns between points 25, FIG. 4) any desired ratio between the absolute magnitudes of the area of the remaining nub (e.g. 25, FIG. 4) and of the etching trough (e.g. as at 4', FIG. 1) can be achieved. Thus, the area of nubs 25, FIG. 4, may be in the range from four to one hundred square microns where the basic grid pattern corresponds to ten microns on a side, or a total area of one hundred square microns. Thus for a nub area of four square microns, the trough width might be eight microns and the trough depth might also be eight microns. For a photosensitive layer thickness of two microns in FIG. 1, the etching into the carrier would then have a depth of at least six microns, while in FIG. 4, the depth of the troughs in carrier 26 might be eight microns. Given an isotropically attacking etching agent, the same dimension results for the trough width and for the trough depth. This produces the advantage that the coalescence of neighboring luminescent layer components can be terminated by means of controlled etching of various degree.

Figure 2:
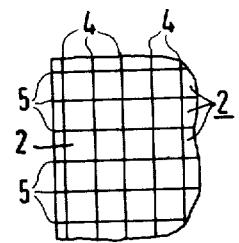
FIG. 2 shows a partial plan view of the screen according to FIG. 1 prior to application of the reflective and luminescent layers.

At first, the photo grid e.g. 2, 4, 5, FIG. 2, can be manufactured as in the German OS No. 26 47 660 cited above in that a photoelectric layer, for example photosensitive polyimide material, is applied which is then exposed through an exposure mask (vignette). Suitable materials are described, for instance, in the German LP No. 2,308,830 and the German OS No. 24 37 348 and OS No. 24 37 422 as well as in "Polymer Engineering and Science," September 1971, Vol. 11, No. 5, pages 426 through 430.

The photosensitive layer 2 can be produced according to a lacquering method known per se or similar methods. After the exposure of the grid, preferably with ultraviolet (UV) rays, the unexposed parts of the layers are removed with organic solvents, for example, in an immersion or spray development process. Suitable solvents, for example, are a 1:1 mixture of dimethylformamide and ethanol or gammabutyrolacetone. The remaining photographically defined parts 2 of the grid 2, 4, 5, FIG. 2, are finally converted into stable synthetic by means of heating, for example 30 minutes at 275° C. and, subsequently, 10 through 15 minutes at 400° C.

As in the known method, the grid 2, 4, 5, FIG. 2, can be adapted to the desired resolution of the luminescent screen 12, FIG. 3. Given a point grid as in FIG. 2 or 4 for the input screen of X-ray image intensifier 10, for example, a point grid is suitable in which the side length of each basic grid square as in FIG. 2, at the center lines of troughs 4, 5, amounts to a value in the range from three to thirty microns (3 to 30 μm) given a center to center interval of the grid points from one another of a selected value in the range from three through forty microns (3 through 40 μm), particularly ten microns (10 μm), when a luminescent screen of 120 μm thickness cesium iodide activated with sodium is provided per square centimeter (cm$^2$), as measured by successive weighings of carrier 1. If a thicker luminescent substance coating is planned, then the dimensions change proportionally.

Before application of the luminescent layer 3 or 23 by means of vacuum deposition, the carrier is inventively further prepared in that the grid (with a pit ratio of one to one as in the fourth figure of German OS No. 26 47 660) is subjected to a further etching process. This can be achieved in the above sense in that the exposed surfaces of the carrier metal e.g. of carrier 1 between the synthetic nubs (e.g. at 2, FIG. 2) are converted into troughs as at 4', FIG. 1 by means of treatment, for instance immersion or spraying, with an etching mixture known per se consisting of concentrated mineral acids. The etching mixture, for example, can be composed of 80 volume parts o-phosphoric acid, 10 volume parts sulfuric acid and 10 volume parts nitric acid, whereby it is advantageous when an additive of a small amount of heavy metal salt (approximately 1/100 part by weight or one percent by weight) is present whose anion is the acid anion of one of the said mineral acids, for example iron sulfate. Salts of other agents, such as manganese, magnesium, nickel or copper, may likewise be employed.

In order to generate an extreme point grid, this latter etching of the grid is carried out in such manner that, given a temperature increased to a value in the range from approximately 100° through 120° C., the contact area between the synthetic nub such as 2, FIG. 2, and carrier metal such as 1 is reduced to a value in the range from four through one hundred square microns (4 through 100 μm$^2$).

Instead of employing synthetic as the covering for producing the grid before the etching, other etching and heat-resistant substances can be employed such as, for example, a coating of nickel. This can be applied, for example on an aluminum disc such as 1, FIG. 1, or 11, FIG. 3, to a thickness of a value in the range from two through twenty microns (2 μm through 20 μm) by means of galvanic or current-free reduction of nickel compounds. Then, a photo grid is first applied, this is etched with acid until the grid has completely penetrated the nickel layer (as for layer 2 in FIGS. 1 and 2) and then a further etching of the carrier metal ensues by means of caustic solution, particularly two gram molecular weights per liter (2 M) sodium hydroxide solution (NaOH).

Before applying the luminescent substance, the carriers 1, 11, 26 have a grid structure formed with aluminum and synthetic nubs, FIG. 2, or aluminum and nickel nubs, or pure aluminum nubs (at 25, FIG. 4), either flat, or as in FIG. 3 at the concave side of carrier 11 (which is of dish shape), and for FIG. 1 with the reflective layer 2' deposited as in the fourth figure of German OS No. 26 47 660, onto the nubs 2 and carrier troughs 4' of FIG. 1. Such grid structures are then placed in a vacuum deposition apparatus and are coated to the desired thickness with cesium iodide activated with sodium.

We claim as our invention:

1. In an X-ray image intensifier,
   a luminescent input screen arranged for receiving an X-ray image, and
   utilization means coupled with said luminescent input screen for producing an intensified image in accordance with the X-ray energy absorbed by the input screen,
   said luminescent input screen comprising an X-ray permeable carrier for transmitting an X-ray image from a first side thereof to a second side thereof, and having a grid structure at the second side thereof, and
   a luminescent layer vacuum deposited onto the grid structure to exhibit a grid pattern and having a thickness dimension in the direction of the incident X-ray image for absorbing X-ray energy after transmission through the carrier,
   characterized in that
   said grid structure comprises point regions arranged in a grid configuration with interstices surrounding each of the point regions,
   said interstices being etched into the material of said carrier, and said luminescent layer being vacuum deposited onto the point regions so as to form columns extending from the respective point regions a distance representing the thickness dimension of the luminescent layer.

2. An X-ray image intensifier according to claim 1, characterized in that the grid structure onto which the luminescent layer is vacuum deposited comprises a photo grid of a heat-resistant synthetic material, and in that the etching of the carrier is by means of a mineral acid etching mixture.

3. An X-ray image intensifier according to claim 1, with
   said utilization means supplying an intensified electron image in accordance with the X-ray image incident on the luminescent layer, and
   an output screen for receiving said electron image and supplying an optical image in accordance therewith,
   said output screen being of construction corresponding to said input screen.

4. An X-ray image intensifier according to claim 2, characterized in that the etching mixture consists of eighty volume parts concentrated o-phosphoric acid, ten volume parts concentrated sulfuric acid and ten volume parts concentrated nitric acid and in that iron sulfate in the amount of 1/100 of the weight of this mixture is added to this mixture.

5. An X-ray image intensifier according to claim 1, characterized in that the grid structure includes a heat-resistant substance comprised of nickel, the nickel being etched with acid and the carrier material being etched with caustic solution.

6. An X-ray image intensifier according to claim 1, characterized in that the grid structure is essentially free of grid coating material initially used to form the grid pattern.

7. An X-ray image intensifier according to claim 1, the grid structure having surfaces thereof coated with a reflecting layer in underlying relation to the luminescent layer.

8. An X-ray image intensifier according to claim 7, characterized in that the reflecting layer is a coating of aluminum.

* * * * *